United States Patent [19]

Parkinson

[11] 4,337,524

[45] Jun. 29, 1982

[54] BACKUP POWER CIRCUIT FOR BIASING BIT LINES OF A STATIC SEMICONDUCTOR MEMORY

[75] Inventor: Ward D. Parkinson, Boise, Id.

[73] Assignee: Mostek Corporation, Carrollton, Tex.

[21] Appl. No.: 119,538

[22] Filed: Feb. 7, 1980 (Under 37 CFR 1.47)

[51] Int. Cl.³ ............................................. G11C 11/40
[52] U.S. Cl. .................................... 365/229; 365/189; 371/66
[58] Field of Search ........................... 365/229; 371/66

[56] References Cited

U.S. PATENT DOCUMENTS

| | | | |
|---|---|---|---|
| 3,859,638 | 1/1975 | Hume, Jr. ............................. | 365/229 |
| 4,051,945 | 10/1977 | Fujimoto et al. .................... | 365/229 |
| 4,122,359 | 10/1978 | Breikss ................................ | 365/229 |

*Primary Examiner*—Terrell W. Fears

[57] ABSTRACT

A circuit is provided for biasing the bit lines of a static semiconductor memory when each of the cells (150) within the memory is being powered by a backup power source due to failure of the primary power source. The bit lines (52) connected to the cells within the array (50) are connected to transistors (54) which bias the bit lines (52) to a high voltage upon detection of failure of the primary power for the computer. The bit lines (52) are maintained at a high voltage level to prevent discharge of a data storage node (156) through an access transistor (164) of a memory cell (150). Biasing of the bit lines (52) further prevents the integrated circuit substrate (150) from being driven excessively positive by capacitive coupling between the substrate (150) and the bit lines (52) when the primary power is restored to the circuit.

3 Claims, 3 Drawing Figures

BACKUP POWER CIRCUIT FOR BIASING BIT LINES OF A STATIC SEMICONDUCTOR MEMORY

TECHNICAL FIELD

This invention relates generally to integrated semiconductor memory circuits utilizing field effect transistors and more particularly pertains to a circuit for automatically biasing the bit lines of static memory cells upon loss of the main power source to maintain the bit pattern stored in the memory array.

BACKGROUND ART

Heretofore bulk memories for computer systems have frequently utilized magnetic core technology wherein a large number of magnetic rings are employed with each ring serving as a memory storage element. The data state of the ring is dependent upon the direction of magnetization of the ring. A primary advantage of this type memory is that the information stored in the memory is not lost when power is removed. The rings remain magnetized in the selected states even when power is not supplied to the memory unit. A magnetic core memory can be reactivated and returned to use immediately upon reapplication of electrical power. There is no need to reload the programs and data into memory each time the power is disconnected.

In large computer systems, programs and data are frequently stored on disk memories so that the system can be initialized from disk, even after a power failure. But in smaller computer applications, programs and data are often entered manually and are not stored in any readily accessible manner. Therefore, a power loss which causes loss of the stored bit pattern in memory is a serious failure of the system which cannot be remedied by merely restoring main power.

There have recently come into widespread use semiconductor random access memories which have decided advantages over the older core type memories. In particular, the newer memories are faster, have lower power consumption and occupy less space. However, a serious drawback in the use of semiconductor memories is that each of the memory element circuits is volatile, that is, the information stored in the memory element is lost when power is removed from the memory circuit. With such a memory system the programs and data stored in the memory are lost whenever power is removed from the memory unit. Although the loss of power does not result in circuit damage, the loss of stored information does require that the system be reloaded with programs and data before processing can continue. The reloading of programs is a time consuming process which reduces the efficient utilization of a computer system. In certain types of systems a provision is made to transfer the contents of memory to disk when a failure is first indicated. But in many computer systems a power failure occurs so rapidly that all of the memory contents cannot be transferred to disk. This is particularly true for process control systems.

It has been proposed in using static semiconductor memory systems that backup power be automatically supplied to the memory circuit upon detection of failure of the primary power. When the memory circuit is receiving backup power the bit lines which transfer data into and from the memory cells is permitted to go to a low state. In this low state it is very possible that the individual memory cells can be discharged due to sub-threshold conduction if the memory stays in the backup mode for a prolonged period of time. Further when power is eventually restored there will be a substantial capacitive coupling of the substrate of the memory due to the capacitance between the bit lines, other internal nodes and the substrate. It is likely that a substantial transient voltage applied to the substrate will cause data to be effected in the memory cells.

Therefore, there exists a need for a circuit for protecting the bit pattern stored in the memory cells of a static memory when the memory itself is connected to operate on a backup power source after failure of the main power supply.

DISCLOSURE OF THE INVENTION

The present invention comprises a circuit for preventing loss of the bit pattern stored in the memory cells of a static semiconductor memory upon failure of the primary power supplied to the memory while a backup power supply is connected to the memory cells. The memory cells within the memory have bit lines for transferring information as voltage states to and from the memory cells. The present invention includes a circuit for detecting a failure of the primary power for the memory and a further circuit for applying a predetermined voltage state to each of the bit lines upon detection of the failure of the primary power.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Most computer systems have power supplies which not only provide transformation and rectification of the line alternating current but include circuitry for monitoring the line current to detect a failure. The filters within such power supplies have sufficient energy storage so that a line failure can be detected and a warning supplied to the computer so that the computer has sufficient time to take actions to prevent the loss of data and to prevent damage to peripheral systems, such as disk drives. After an AC line signal is lost, the power supply can continue to provide power for a period of a few milliseconds. Upon receiving a warning that the line current has failed the computer can switch in a backup power source so that the data stored in memory can be preserved.

In conjunction with the present invention a backup power supply is connected to a multiplexed terminal for each memory circuit so that the memory array within the circuit can continue to be powered to maintain the data stored therein until full power is recovered. A circuit is included to provide for a transition of powering the memory array from the normal power terminal to a selected pin upon loss of primary power. The selected pin is normally used to receive a control signal for the memory circuit. The circuit further prohibits any reading or writing in the memory array while in the backup mode and also provides a smooth transition from the backup mode to normal operation when primary power is restored. The secondary power is provided only to the memory array and not to the peripheral supporting circuits which cannot be used in the backup mode in any case. If high impedance loads are used in the memory cells of the array, extremely low power consumption can be achieved in the backup mode.

Figure 1:
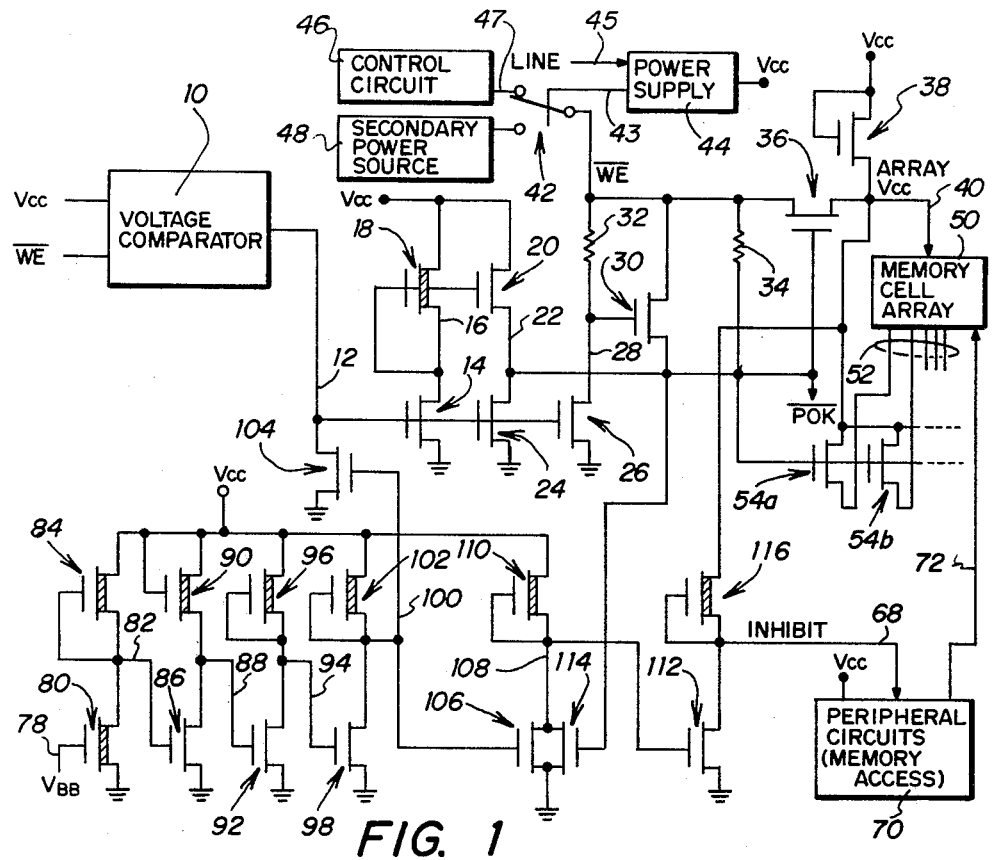
FIG. 1 is a schematic circuit diagram of a backup memory circuit in accordance with the present invention.

Referring now to FIG. 1 there is shown a schematic diagram of the backup power circuit which includes the circuit of the present invention. The primary power, $V_{cc}$, is supplied to the circuit through a selected external pin to a primary power terminal for the memory circuit. The backup power is supplied to the circuit by multiplexing a particular pin which in this embodiment is the write enable pin. During routine operation of the memory circuit a write enable ($\overline{WE}$) signal controls whether the circuit is operating in a read or write mode. But, upon loss of primary power, external circuitry disconnects the write enable signal and substitutes on the $\overline{WE}$ pin a backup or secondary power source, generally a battery.

A voltage comparator 10 is connected to the primary power terminal receiving $V_{cc}$ and to the $\overline{WE}$ terminal which receives the $\overline{WE}$ signal. Voltage comparator 10 produces a high level at node 12, the voltage comparator output, when Vcc is greater than the voltage on the $\overline{WE}$ terminal. Node 12 is set to a low level when $V_{cc}$ is less than the voltage on the $\overline{WE}$ terminal. The voltage comparator 10 can further be operated so that a high voltage is produced on node 12 when the voltage on the $\overline{WE}$ terminal is not greater than the power voltage $V_{cc}$ by a preselected voltage offset, and a low voltage is produced at node 12 when the voltage on the $\overline{WE}$ terminal is greater than the power voltage $V_{cc}$ by the preselected voltage offset. Thus, if $\overline{WE}$ is held at a high level, the output node 12 of voltage comparator 10 transitions from a high level to a low level when $V_{cc}$ falls from its normal operating range.

Node 12 is connected to the gate terminal of a transistor 14 which is turned on when the voltage on node 12 is high but is rendered nonconductive when the voltage on node 12 is low. Transistor 14 is therefore turned off when $V_{cc}$ becomes less than the voltage on the $\overline{WE}$ terminal less the preselected offset. The drain terminal of transistor 14 is connected to a node 16 which has a high level when transistor 14 is nonconductive. But when transistor 14 is made conductive, node 16 is pulled to a low potential.

Node 16 is connected to both the gate and source terminals of a depletion mode field effect transistor 18. The drain terminal of transistor 18 is connected to $V_{cc}$. Transistor 18 serves as a resistive load to limit current flow through transistor 14.

Node 16 is further connected to the gate terminal of transistor 20 which has the drain terminal thereof connected to $V_{cc}$. When node 16 transitions from a low level to a high level, transistor 20 is turned on thus elevating a node 22 to a high level which is $V_{cc}$ minus the threshold voltage, $V_t$, of transistor 20. Node 22 is connected to both the source terminal of transistor 20 and the drain terminal of a transistor 24. The source terminal of transistor 24 is connected to a common ground. Node 22 serves as a power status node and is connected to an output terminal designated $\overline{POK}$. The signal represented by $\overline{POK}$ is a status signal which indicates that the primary power for the circuit is within the proper operating range. This signal is an active low which means that the acceptable status is indicated by a low level while an unacceptable status is indicated by a high level. The signal level on node 22 is influenced by connections at a plurality of points within the circuit.

Node 12, the output of voltage comparator 10, is further connected to the gate terminal of a transistor 26 which is turned on when node 12 is at a high level. The drain of transistor 26 is connected to a node 28 which is further connected to the gate terminal of a transistor 30. A resistor 32 is connected between the $\overline{WE}$ terminal and the gate of transistor 30. The drain terminal of transistor 30 is also connected to the $\overline{WE}$ terminal while the source terminal of transistor 30 is connected to node 22.

A resistor 34 is connected between the $\overline{WE}$ terminal and node 22. A transistor 36 has the gate terminal thereof connected to node 22 while the drain terminal is connected to the $\overline{WE}$ terminal and the source terminal is connected to a memory array $V_{cc}$ node 40. The array $V_{cc}$ is the supply voltage for the memory cells within the memory circuit.

As noted above, the primary power for the entire circuit is provided by $V_{cc}$. This primary power source is further connected to the gate and drain terminals of a transistor 38 which has the source terminal thereof connected to supply the array $V_{cc}$ which is designated as node 40.

The $\overline{WE}$ terminal is connected to a switch 42 which is controlled by an output line 43 from a power supply 44. A line supply 45, generally 120 volts at 60 Hz, is input to the power supply 44 to produce the voltage $V_{cc}$ for powering the memory circuit. The switch 42 connects the $\overline{WE}$ terminal to either a control circuit 46 which generates the write enable signal or to a secondary power source 48, such as a battery. The write enable signal is transmitted from control circuit 46 through a control line 47 which is connected to one input terminal of switch 42.

The power supply 44 includes circuitry to monitor the incoming line voltage and determine when such voltage has failed. A power supply which provides this function is a model H7100 manufactured by Digital Equipment Corporation. Upon noting such a failure, the power supply 44 through line 43 causes the switch 42 to move from the normal connection with the control circuit 46 to connection with the secondary power source 48. The filter capacitors within the power supply 44 are of sufficient size to enable the power supply to provide sufficient power for its own operation and sufficient current to maintain $V_{cc}$ for a period of a few milliseconds. Thus, the switch 42 serves to multiplex the operation of the $\overline{WE}$ terminal so that in the event of a failure of primary power the $\overline{WE}$ terminal is connected to receive backup power to supply the memory circuit. In the preferred embodiment the secondary power source 48 is a battery or a battery driven power supply. Switch 42 is preferably a logical or solid state switch rather than a mechanical switch.

The array $V_{cc}$, node 40, is connected to power memory cells 50 for normal operations and for data protection in the backup mode. The circuitry for the memory cells 50 is described and illustrated in U.S. Pat. No. 3,967,252 to Donnelly. The memory cells 50 include a plurality of bit lines 52, each of which is connected to a plurality of the individual memory cells within circuit 50. Each of the bit lines is connected to the source terminal of a corresponding transistor 54a, 54b, . . . The drain terminals of the transistors 54 are connected in common to the array $V_{cc}$ at node 40. The gate terminals of the transistors 54 are connected in common to the node 22 which indicates the status of the power supplied to the memory circuit.

Referring to the lower portion of FIG. 1, the primary voltage supply $V_{cc}$ is supplied to a plurality of transistors which are utilized to generate an inhibit signal on node 68 which activated prohibits the writing of data into the memory cell array after the line supply has been lost and the memory is operating in the backup mode. Node 68 is connected to supply the inhibit signal to peripheral circuits 70 which control and access the memory cell array 50 through a communication path 72. When circuits 70 are inhibited, no action can be taken to read or write data in the memory cell array 50, thus preserving the bit pattern stored therein.

A substrate bias voltage $V_{BB}$ is transmitted through a node 78 to the gate terminal of a depletion mode transistor 80. The source terminal of transistor 80 is grounded and the drain terminal thereof is connected to a node 82 which serves as a substrate bias monitor mode.

A depletion mode transistor 84 is connected at its drain terminal to $V_{cc}$ while its gate and source terminals are connected to node 82. Transistor 84 serves essentially as a load impedance for transistor 80. Node 82 is further connected to the gate terminal of a transistor 86 which has its source terminal grounded. The drain terminal of transistor 86 is connected to a node 88 that is also connected to the source terminal of a depletion mode transistor 90. Both the gate terminal and the drain terminal of transistor 90 are connected to $V_{cc}$ so that transistor 90 operates as a load impedance for transistor 86.

Node 88 is further connected to the gate terminal of a transistor 92 which has its source terminal grounded. The drain terminal of transistor 92 is connected to a node 94 which is in turn connected to the gate and source terminals of a depletion mode transistor 96. The drain terminal of transistor 96 is likewise connected to $V_{cc}$. Transistor 96 serves as a load impedance for transistor 92.

Node 94 is further joined to the gate terminal of a transistor 98 which has its source terminal grounded. The drain terminal of transistor 98 is connected to a node 100. Both the gate and source terminals of a depletion mode transistor 102 are connected to node 100 while the drain terminal of transistor 102 is likewise connected to $V_{cc}$. Transistor 102 operates as a load impedance for transistor 98.

Node 100 extends to the gate terminal of a transistor 104 which has its drain terminal joined to node 12. The source terminal of transistor 104 is grounded. When node 100 goes high, transistor 104 is turned on which pulls node 12 low.

Node 100 is further connected to the gate terminal of a transistor 106 which has the source terminal thereof grounded. The drain terminal of transistor 106 is connected to a node 108 that is joined to the gate and source terminals of a depletion mode transistor 110. The drain terminal of transistor 110 is connected to $V_{cc}$. Node 108 is further connected to the gate terminal of a transistor 112 which has its source terminal grounded. The drain terminal of transistor 112 is connected to node 68. Node 108 is further connected to the drain terminal of a transistor 114, the gate terminal of which is connected to node 22 and the source terminal of which is grounded.

Node 68, which transmits the inhibit signal to circuits 70, is further joined to the gate and source terminals of a transistor 116 which has the drain terminal thereof connected to node 40. Transistor 116 limits the current flow through transistor 112.

Figure 3:
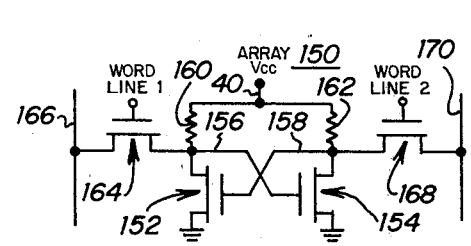
FIG. 3 is a schematic circuit diagram of a static memory cell which is used in conjunction with the present invention.

A typical memory cell as included in the memory cell array 50 is illustrated in FIG. 3. A static memory cell 150 is made up of a plurality of field effect transistors together with load resistors. The cell includes transistors 152 and 154 each of which has the source terminal thereof connected to ground. Transistor 152 has the drain terminal thereof connected to a node 156 which is connected to the gate terminal of transistor 154. The drain terminal of transistor 154 is connected to a node 158 which is connected to the gate terminal of transistor 152. A load resistor 160 is connected between the memory cell array power node 40 and node 156. A load resistor 162 is connected between the memory cell array 40 and the node 158. Cell 150 is provided with a first access transistor 164 which has its drain and source terminals connected between a bit line 166 and the node 156. A second access transistor 168 has its drain and source terminals connected between a bit line 170 and the node 158. The gate terminal of both transistors 164 and 168 are connected to word line 1 that receives a word line signal to connect node 156 to bit line 166 and node 158 to bit line 170. The bit lines 166 and 170 are two examples of the bit lines included within the group 52 illustrated in FIG. 1.

Referring to FIG. 1 for an operational description of the circuit of the present invention, the purpose of the circuit in FIG. 1 is to supply sufficient backup power to the memory cells 50 of the memory circuit so that the data pattern present in the cells is retained despite loss of primary power. The circuit must further inhibit the peripheral circuits 70 to prohibit the writing of possibly erroneous data into the memory cells 50 after a failure of the primary power supply. The circuit further supplies a signal indicating the status of the main power supply, this being the $\overline{POK}$ signal on node 22.

Under normal operations $\overline{POK}$ is low so that transistor 36 is turned off. $V_{cc}$ is normally at a five volt level plus or minus 10%. Transistor 38 functions as a diode and is turned on so that the array $V_{cc}$, node 40, is at a voltage of $V_{cc}$ minus one threshold voltage $V_t$.

When the primary supply providing $V_{cc}$ fails, the voltage on node 22 is pulled upward in a series of steps. When the voltage comparator 100 detects that the voltage on the $\overline{WE}$ terminal exceeds $V_{cc}$, or optionally exceeds $V_{cc}$ by more than a preselected voltage offset, node 12 is driven low which causes transistors 14, 24 and 26 to be turned off. As $V_{cc}$ falls from five volts, node 16 is pulled up rapidly to the $V_{cc}$ potential, which would be around four volts. Since node 16 is connected to the gate terminal of transistor 20, the voltage on node 16 causes transistor 20 to be turned on thereby elevating node 22 to a voltage which is one threshold $V_t$ below $V_{cc}$. In this embodiment $V_t$ is generally 1 volt. Thus, when $V_{cc}$ begins to drop, node 22 is rapidly pulled up to approximately a three volt level. But, as $V_{cc}$ continues to fall, transistor 20 will not pull the voltage on node 22 to zero. When $V_{cc}$ drops to the range of 1-2 volts, there will be insufficient bias on the gate terminal of transistor 20 to hold it turned on. Transistor 20 will then turn off and isolate node 22 from the $V_{cc}$ terminal.

When the output node 12 of comparator 10 changes from high to low, node 22 will be snapped up to $V_{cc}-V_t$. This voltage on node 22 is sufficient to turn on transistor 114 which in turn causes transistor 112 to be turned off thereby applying the inhibit signal to circuits 70 to protect the data in memory cells 50.

The next step in charging node 22 is provided by transistor 30 which has its gate terminal quickly charged up to the potential on the $\overline{WE}$ terminal when transistor 26 is turned off. This pulls node 22 up to the voltage on the $\overline{WE}$ terminal minus one threshold voltage $V_t$, that being of transistor 30. The final step in charging node 22 is provided by resistor 34. This resistor charges node 22 upward to the full potential on the $\overline{WE}$ terminal. Thus, node 22 which corresponds to the $\overline{POK}$ signal is raised from low to high when $V_{cc}$ becomes less than the voltage on the $\overline{WE}$ terminal by a specific offset.

When $V_{cc}$ falls from high to low, transistor 38 will be turned off while the transition of node 22 from low to high causes transistor 36 to be turned on thereby connecting the $\overline{WE}$ terminal to the memory array $V_{cc}$ node 40. Thus, in the backup mode the array $V_{cc}$ is equal to the voltage on the $\overline{WE}$ terminal minus one threshold drop which occurs across transistor 36.

In the normal power mode the $\overline{WE}$ terminal is connected to a very high impedance circuit which draws little current and allows the control signal on this terminal to function in its normal manner in supplying a write signal to the memory circuit. But in the backup mode the write signal will not be used, and the $\overline{WE}$ terminal is connected to supply the backup power to the memory cells through the array $V_{cc}$ node 40.

The inhibit signal at node 68 is generated to disable the peripheral circuits 70 to prevent any data from being written into the memory cells. When node 22 rises from low to a level of several volts, transistor 114 is turned on thereby pulling down node 108. A low potential on node 108 causes transistor 112 to be turned off thereby elevating node 68 to the potential of the array $V_{cc}$, node 40.

Note that when $V_{cc}$ is lost the peripheral circuits do not draw any current from the secondary power source 48 since they are powered solely by $V_{cc}$.

Each memory cell within the memory cells 50 is connected to a pair of the bit lines 52 such as lines 166 and 170. The bit lines are utilized to transfer data state information into and out of the individual cells as shown in FIG. 3. The transistors 54 are connected so that each bit line is supplied with the array $V_{cc}$ minus one threshold $V_t$. It is important that this voltage be maintained on the bit lines since over a period of time the voltage states on nodes 156 and 158 can discharge through the respective access transistors 164 and 168 as a result of subthreshold conduction. The bit lines in a semiconductor memory are routed through each memory cell and thus form a rather extensive conductor pattern on the integrated circuit. A substantial capacitive effect is developed between the bit lines and the circuit substrate due to geometry and p-n junction capacitance.

During the backup mode there will be no signals applied externally to the bit lines for the semiconductor memory. Without an externally applied signals these lines will go to essentially ground level. When the main power is restored to the computer system all of the bit lines will have high levels immediately applied thereto. Due to the capacitive coupling of the bit lines to the substrate, the voltage on the substrate will be suddenly elevated due to this capacitive coupling. If the voltage of the substrate is pulled to greater than 0 volts it is likely that operation of many of the individual memory cells will be adversely affected and the data stored in these cells will be lost. The purpose of the on board pump generator described herein is to maintain the substrate at a substantially negative voltage to prevent such a problem. But during backup operation the auxiliary substrate pump can provide only a weak negative bias to the substrate.

The circuit of the present invention provides a method to prevent loss of data due to both subthreshold leakage through the access transistors and data loss due to capacitively coupling the substrate through an excessively positive voltage. This is accomplished by biasing the bit lines for each of the individual memory cells to a high voltage. This high voltage is applied to the bit lines 52 through the transistors 54. Referring to FIG. 3 the elevated voltage is applied to the individual bit lines 166 and 170. A high level voltage will be present on one of the nodes 156 or 158 and it is this high level voltage that must be protected from subthreshold leakage. If both of the bit lines are maintained at a high voltage level there will be no leakage through the access transistor connected to the high node since there is no voltage differential across this transistor. For the transistor connected to the low node, any leakage can be overcome by the pulldown transistor, 152 or 154. Further, the high level bias on the bit lines will reduce the magnitude of the sudden upward voltage transition on the substrate when the main power is restored to the memory circuit as a whole.

Figure 2:
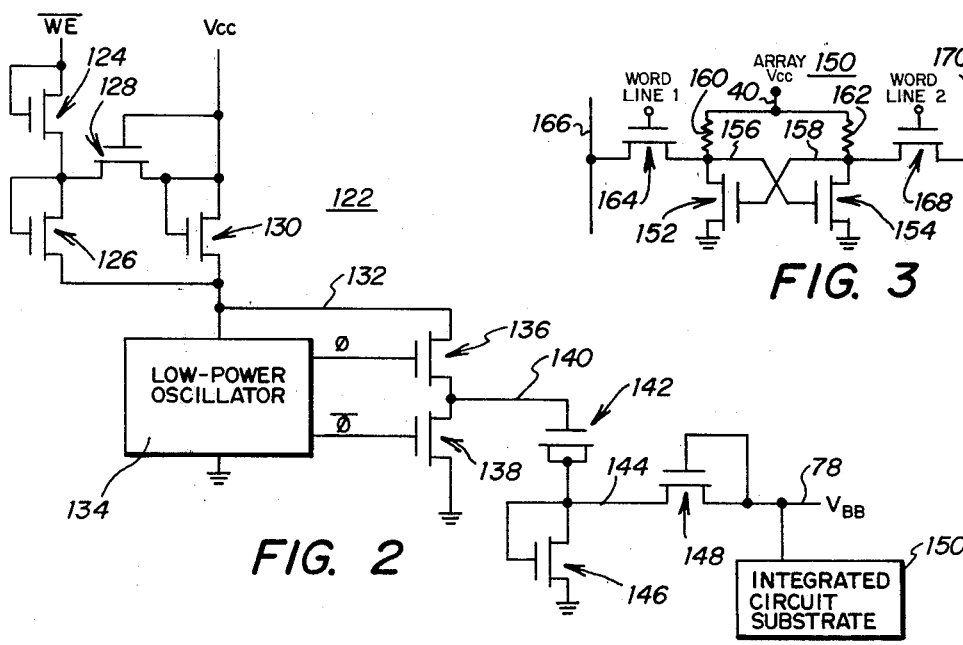
FIG. 2 is a schematic circuit diagram of an auxiliary pump generator provided with a power source selection circuit.

Referring now to FIG. 2 a further feature related to the present invention involves a substrate bias voltage $V_{BB}$. In MOS (metal oxide semiconductor) circuits it is desirable to maintain the substrate with a negative bias voltage. Under normal operations a primary substrate pump provides a regulated $-4$ volts to the substrate for optimum performance of the circuit. This pump is disabled when $V_{cc}$ is lost.

The substrate bias voltage is also important in regard to the transition from the backup mode to primary power. The primary power terminal is capacitively coupled to the substrate and will tend to pull the substrate positive when $V_{cc}$ is reestablished. If the substrate is drawn from a negative voltage to zero volts or positively biased, as described above, there is a substantial likelihood that data will be lost. Therefore the bias voltage $V_{BB}$ must be sufficiently negative to prevent the substrate from being pulled to a positive potential through capacitive coupling to the primary power terminal.

The circuit of FIG. 2 is an auxiliary substrate pump which provides sufficient negative bias for the substrate to maintain the data pattern in the memory cells. The auxiliary substrate pump 122 is connected to both the $V_{cc}$ primary power source and the $\overline{WE}$ terminal for backup power. $V_{cc}$ and the $\overline{WE}$ terminal are connected to power the substrate pump circuit 122 through a gating arrangement of transistors 124, 126, 128 and 130. Each of these four transistors has the gate terminal connected to its drain terminal so that the transistor functions essentially as a diode. When $V_{cc}$ exceeds the voltage on the $\overline{WE}$ terminal less $V_T$ transistors 128 and 130 will be turned on thereby connecting $V_{cc}$ to a node 132 with a one threshold voltage drop. Under these conditions transistors 124 and 126 are turned off thereby isolating the $\overline{WE}$ terminal through a high impedance from V$_{cc}$ and the circuit 122.

When the voltage on the $\overline{WE}$ terminal exceeds V$_{cc}$ plus V$_T$, transistors 124 and 126 are turned on while transistors 128 and 130 are turned off. This arrangement connects the $\overline{WE}$ terminal to node 132 while isolating V$_{cc}$ from the $\overline{WE}$ terminal and node 132. Thus, node 132 is connected to the higher of either V$_{cc}$ or the voltage on the $\overline{WE}$ terminal.

Node 132 is connected to supply power to a low power oscillator 134 and to a transistor 136. Oscillator 134 generates an in-phase signal designated as $\phi$ and the inverse of $\phi$ which is designated as $\overline{\phi}$. The signal $\phi$ is input to the gate of transistor 136 while the $\overline{\phi}$ signal is input to the gate of a transistor 138. The source terminal of transistor 136 is connected to a node 140 which is in turn connected to the drain terminal of transistor 138. The source terminal of transistor 138 is grounded. The out-of-phase signals input to transistors 136 and 138 produce a square wave signal at node 140. The signal on node 140 is transmitted to the gate terminal of a transistor 142 which is connected to function as a capacitor. The source and drain terminals of transistor 142 are interconnected at a node 144. A transistor 146 has its drain and gate terminals connected to node 144 while the source terminal thereof is grounded so that transistor 146 functions as a diode biased toward ground. Node 144 is further connected to the source terminal of a transistor 148 which also has its gate and drain terminals interconnected so that transistor 148 functions as a diode biased toward node 144.

Still referring to FIG. 2, oscillator 134 produces signals which are out of phase and thereby produce a square wave signal at node 140. The square wave is transmitted from node 140 to node 144 through transistor 142 which functions as a capacitor and blocks DC. When node 144 goes high transistor 146 is turned on so that node 144 is subsequently discharged through transistor 146. When node 144 goes negative transistor 146 is turned off and node 144 is pulled to a negative voltage. A positive voltage on node 144 is blocked by transistor 148 while a negative voltage at node 144 is transmitted through transistor 148 to node 78 (also shown in FIG. 1). Node 78 supplies the substrate bias V$_{BB}$ to the integrated circuit substrate 150 which is integral with the circuits shown in FIGS. 1 and 2.

Referring back to FIG. 1 the circuit shown therein also monitors the substrate bias voltage V$_{BB}$ so that the $\overline{POK}$ signal is driven to a high level when there is insufficient substrate bias. When V$_{BB}$ is sufficiently negative, approximately $-2$ to $-3$ volts, depletion mode transistor 80 is turned off. This action raises node 82 high which turns transistor 86 on thereby lowering node 88. The low voltage on node 88 turns transistor 92 off thereby raising node 94 to a high level. The high level on node 94 turns transistor 98 on thereby pulling node 100 to a low level and turning transistor 104 off. When transistor 104 is turned off node 12 is pulled to go to a high level to indicate that V$_{cc}$ exceeds the voltage on the $\overline{WE}$ terminal. When node 12 is high node 22 is low thereby indicating by signal $\overline{POK}$ that the primary voltage V$_{cc}$ and the bias voltage V$_{BB}$ are satisfactory.

If V$_{BB}$ should not be sufficiently negative and therefore be approximately 0 volts, transistor 80 is on, thereby pulling node 82 low. This action turns transistor 86 off thereby elevating node 88 to a high level. A high level on node 88 turns transistor 92 on thereby pulling node 94 to a low level. The low level on node 94 turns transistor 98 off thereby raising node 100 to a high level and turning transistor 104 on which pulls node 12 to a low level thereby initiating the same sequence of events which occurs when V$_{cc}$ is less than the voltage on the $\overline{WE}$ terminal. The result of an insufficiently negative V$_{BB}$ causes the generation of a high level $\overline{POK}$ signal indicating loss of power and the generation of an inhibit signal which prevents any peripheral circuits from writing data into the memory cells. It also keeps the peripheral circuit disabled to reduce power consumption and prevent bus contention problems.

In summary, the circuit of the present invention provides a means for biasing the bit lines of the cells in a static semiconductor memory. This protects the bit pattern in the cells from loss when the cells are receiving backup power. Data loss could be caused by discharge of a high node due to subthreshold conduction or by driving the substrate positive as a result of capacitive coupling between the bit lines and the substrate.

Although only one embodiment of the invention has been illustrated in the accompanying Drawings and described in the foregoing Detailed Description, it will be understood that the invention is not limited to the embodiment disclosed, but is capable of numerous rearrangements, modifications and substitutions without departing from the scope of the invention.

I claim:

1. A circuit for utilizing a backup power source to prevent loss of the bit pattern stored in the memory cells of a static semiconductor memory upon failure of the primary power supplied thereto, the memory circuit having a plurality of control terminals for receiving control signals and the memory cells having bit lines for transferring information as voltage states to and from the memory cells, comprising:
   means for detecting a failure of the primary power for the memory circuit,
   means for connecting the backup power source to the memory cells through a selected one of the control terminals upon detection of the failure of the primary power, and
   means for applying a predetermined voltage to each of the bit lines upon detection of the failure of the primary power, said predetermined voltage derived from the backup power source through said selected control terminal.

2. The circuit recited in claim 1 wherein said means for applying a predetermined voltage to each of the bit lines comprises a field effect transistor for each of the bit lines, the drain terminals of said transistors connected in common to said selected control terminal, the source terminals of said transistors connected to the respective bit lines and the gate terminals thereof connected to receive a voltage to render the transistors conductive upon detection of said primary power failure.

3. A method for utilizing a backup power souce to prevent loss of the bit pattern stored in the memory cells of a static semiconductor memory upon failure of the primary power supplied thereto, the memory circuit having a plurality of control terminals for receiving control signals and the memory cells having bit lines for transferring information as voltage states to and from the memory cells, comprising:
   detecting a failure of the primary power for the memory circuit,
   connecting the backup power source to the memory cells through a selected one of said control terminals upon detection of the failure of the primary power, and
   applying a predetermined voltage to each of the bit lines upon detection of the failure of the primary power, said predetermined voltage derived from the backup power source through said selected control terminal.

* * * * *